(12) United States Patent
Moran et al.

(10) Patent No.: US 10,886,440 B2
(45) Date of Patent: Jan. 5, 2021

(54) WAVELENGTH CONVERTED SEMICONDUCTOR LIGHT EMITTING DEVICE

(71) Applicant: LUMILEDS LLC, San Jose, CA (US)

(72) Inventors: Brendan Jude Moran, San Jose, CA (US); Oleg Borisovich Shchekin, San Francisco, CA (US); Grigoriy Basin, San Francisco, CA (US); Jeffrey Dellert Kmetec, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/891,613

(22) Filed: Jun. 3, 2020

(65) Prior Publication Data

US 2020/0295235 A1    Sep. 17, 2020

Related U.S. Application Data

(60) Division of application No. 15/104,196, filed on Jun. 13, 2016, now Pat. No. 10,680,142, which is a
(Continued)

(51) Int. Cl.
*H01L 33/50* (2010.01)
*H01L 23/00* (2006.01)
(Continued)

(52) U.S. Cl.
CPC ........... *H01L 33/502* (2013.01); *H01L 24/96* (2013.01); *H01L 25/167* (2013.01);
(Continued)

(58) Field of Classification Search
CPC ..... H01L 33/502; H01L 33/56; H01L 25/167; H01L 33/60; H01L 33/0095;
(Continued)

(56) References Cited

U.S. PATENT DOCUMENTS

| 8,232,117 B2 | 7/2012 | Basin et al. |
| 2008/0048200 A1 | 2/2008 | Mueller et al. |

(Continued)

FOREIGN PATENT DOCUMENTS

| CN | 101636851 A | 1/2010 |
| CN | 102714261 A | 10/2012 |

(Continued)

OTHER PUBLICATIONS

English Translation of Office Action of Japan Patent Office, "Decision of Refuse", Patent Application No. 2016-544677, dated Jun. 11, 2019, 3 pages.
(Continued)

*Primary Examiner* — Mouloucoulaye Inoussa

(57) ABSTRACT

A structure according to embodiments of the invention includes a light emitting device for emitting light having a first peak wavelength. A wavelength converting layer is disposed in a path of light emitted by the light emitting device. The wavelength converting layer absorbs light emitted by the light emitting device and emits light having a second peak wavelength. The wavelength converting layer includes a mixture of a wavelength converting material, a transparent material, and an adhesive material, wherein the adhesive material is no more than 15% of the weight of the wavelength converting layer.

20 Claims, 7 Drawing Sheets

Related U.S. Application Data continuation of application No. PCT/IB2014/066945, filed on Dec. 16, 2014.

(60) Provisional application No. 61/924,761, filed on Jan. 8, 2014.

(51) Int. Cl.

| | |
|---|---|
| *H01L 25/16* | (2006.01) |
| *H01L 27/02* | (2006.01) |
| *H01L 33/00* | (2010.01) |
| *H01L 33/32* | (2010.01) |
| *H01L 33/40* | (2010.01) |
| *H01L 33/56* | (2010.01) |
| *H01L 33/60* | (2010.01) |

(52) U.S. Cl.
CPC ...... *H01L 27/0248* (2013.01); *H01L 33/0095* (2013.01); *H01L 33/32* (2013.01); *H01L 33/405* (2013.01); *H01L 33/501* (2013.01); *H01L 33/56* (2013.01); *H01L 33/60* (2013.01); *H01L 33/505* (2013.01); *H01L 2224/24* (2013.01); *H01L 2224/24137* (2013.01); *H01L 2933/005* (2013.01); *H01L 2933/0041* (2013.01); *H01L 2933/0058* (2013.01)

(58) Field of Classification Search
CPC ... H01L 27/0248; H01L 33/32; H01L 33/405; H01L 33/504; H01L 33/644; H01L 33/641; H01L 27/156; H01L 33/50; H01L 33/54; C25D 13/02; F21V 29/15; F21Y 2105/10
USPC .............. 257/98, 99, 88, 13, 100, E33.013, 257/E33.061, E33.067; 138/29, 27, 26
See application file for complete search history.

(56) References Cited

U.S. PATENT DOCUMENTS

| | | |
|---|---|---|
| 2011/0057205 A1 | 3/2011 | Mueller et al. |
| 2011/0121331 A1 | 5/2011 | Simonian et al. |
| 2011/0266569 A1 | 11/2011 | Basin et al. |
| 2012/0302124 A1 | 11/2012 | Imazu |
| 2013/0062592 A1 | 3/2013 | Yen |
| 2013/0062632 A1 | 3/2013 | Lee |
| 2013/0187174 A1 | 7/2013 | Tischler |
| 2013/0267051 A1 | 10/2013 | Petersen |
| 2013/0334559 A1 | 12/2013 | Vdovin et al. |
| 2014/0070249 A1 | 3/2014 | Yoon et al. |
| 2015/0053263 A1 | 2/2015 | Imamura et al. |
| 2016/0091782 A1 | 3/2016 | Hashizume |
| 2016/0116140 A1 | 4/2016 | Eguchi et al. |

FOREIGN PATENT DOCUMENTS

| | | |
|---|---|---|
| CN | 102906887 A | 1/2013 |
| EP | 2503606 A2 | 9/2012 |
| JP | 2003-268201 A | 9/2003 |
| JP | 2007-150229 A | 6/2007 |
| JP | 2010519757 A | 6/2010 |
| JP | 2012-107096 A | 6/2012 |
| JP | 2012-151436 A | 8/2012 |
| JP | 2012-253223 A | 12/2012 |
| JP | 2013-004905 A | 1/2013 |
| JP | 2013511836 A | 4/2013 |
| JP | 2013-201273 A | 10/2013 |
| WO | 2011/061650 A1 | 5/2011 |
| WO | 2011/093454 A1 | 8/2011 |
| WO | 2013118072 A1 | 8/2013 |
| WO | 2015/104604 A1 | 7/2015 |

OTHER PUBLICATIONS

Article 94(3) EPC dated Mar. 29, 2018, European patent Application No. 14830664.0, 7 pages.

EPO as ISA, International Search Report and Written Opinion dated Mar. 25, 2015 from International Application No. PCT/IB2014/06111, filed Dec. 16, 2014, 12 pages.

WAVELENGTH CONVERTED SEMICONDUCTOR LIGHT EMITTING DEVICE

CROSS REFERENCE TO RELATED APPLICATIONS

This application is a divisional of U.S. patent application Ser. No. 15/104,196 filed on Jun. 13, 2016, which is a continuation of International Patent Application No. PCT/IB2014/066945 filed Dec. 16, 2014 and entitled "Wavelength converted semiconductor light emitting device," which claims benefit of priority to U.S. Provisional Patent Application No. 61/924,761, filed Jan. 8, 2014. Each of the above applications are incorporated herein by reference in their entirety.

FIELD OF THE INVENTION

The present invention relates to a wavelength converted semiconductor light emitting device such as a light emitting diode.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a structure described in more detail in US 2011/0057205. An LED 282 and a transient voltage suppression (TVS) chip 284 are attached to a submount 280. (Metal traces on the submount 280, which connect TVS chip 284 between the power leads of the LED 282, are not shown). Upon a voltage surge, such as due to electrostatic discharge (ESD), the circuit in the TVS chip 284 shorts the transient voltage to ground to bypass the LED 282. Otherwise, the LED 282 may be damaged. TVS circuits are well known. The submount 280 shown in FIG. 1 is part of a wafer on which is mounted many pairings of LEDs and TVS dies. The submount wafer will be later sawed to singulate the LED/TVS pairs. A mold has indentations that are filled with liquid silicone containing phosphor grains. The submount wafer and mold are brought together so that each LED/TVS pair is within the silicone in a single indentation, and the silicone is then cured. The submount wafer is then separated from the mold, and the structure of FIG. 1 results. The molded phosphor lens 286 encapsulates both chips. The type(s) of phosphor used, the density of the phosphor(s), and the shape of the lens 286 are determined by the desired color temperature characteristics. In one embodiment, the phosphor in the lens 286 is a mixture of YAG and red phosphor to create a warm white light when energized by the blue LED 282.

SUMMARY

It is an object of the invention to provide a device with a wavelength converting layer with improved thermal performance.

A structure according to embodiments of the invention includes a light emitting device for emitting light having a first peak wavelength. A wavelength converting layer is disposed in a path of light emitted by the light emitting device. The wavelength converting layer absorbs light emitted by the light emitting device and emits light having a second peak wavelength. The wavelength converting layer includes a mixture of a wavelength converting material, a transparent material, and an adhesive material, wherein the adhesive material is no more than 15% of the weight of the wavelength converting layer.

A method according to embodiments of the invention includes attaching a plurality of light emitting devices to a substrate. A wavelength converting layer including a wavelength converting material, a transparent material, and an adhesive material is formed over the plurality of light emitting devices. The light emitting devices are separated by cutting the wavelength converting layer. The substrate is removed.

DETAILED DESCRIPTION

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

In embodiments of the invention, a wavelength converting layer is formed over a light emitting device such as an LED such that the LED die is surrounded on five sides by the wavelength converting layer. The wavelength converting layer may include a wavelength converting material, a transparent material, and an adhesive material. The wavelength converting layer may have high thermal conductivity. In addition, since the material is formed over the device for example by molding, the particle content of the wavelength converting layer (i.e. the wavelength converting material and the transparent material) can be significant; for example, up to 90% of the wavelength converting layer by weight in some embodiments. Though the examples below refer to molding the wavelength converting layer, adhesive materials besides molding compound and techniques besides molding may be used to form the wavelength converting layer and are within the scope of embodiments of the invention. For example, in embodiments of the invention, the wavelength converting layer includes wavelength converting material, transparent material, and a sol-gel adhesive material. Such a wavelength converting layer may be formed by dispensing the wavelength converting layer in liquid form then curing the sol gel material.

Figure 2:
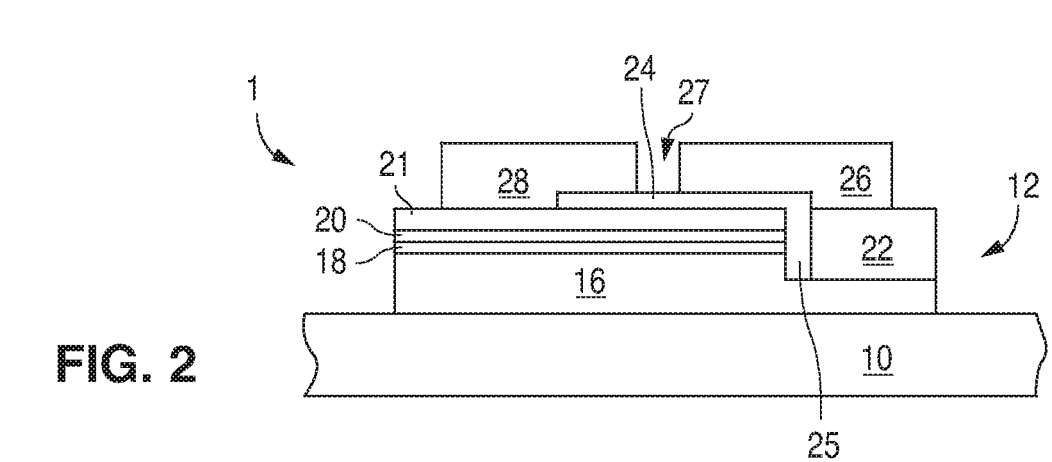
FIG. 2 illustrates one example of a III-nitride LED.

FIG. 2 illustrates a III-nitride LED that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure 12 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED, one or more interconnects 26 and 28 are formed on or electrically connected to the n- and p-contacts 22 and 21. Interconnect 26 is electrically connected to n-contact 22 in FIG. 2. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from a wafer of devices. The semiconductor structure and the n- and p-contacts 22 and 21 are represented in the following figures by block 12.

Figure 3:
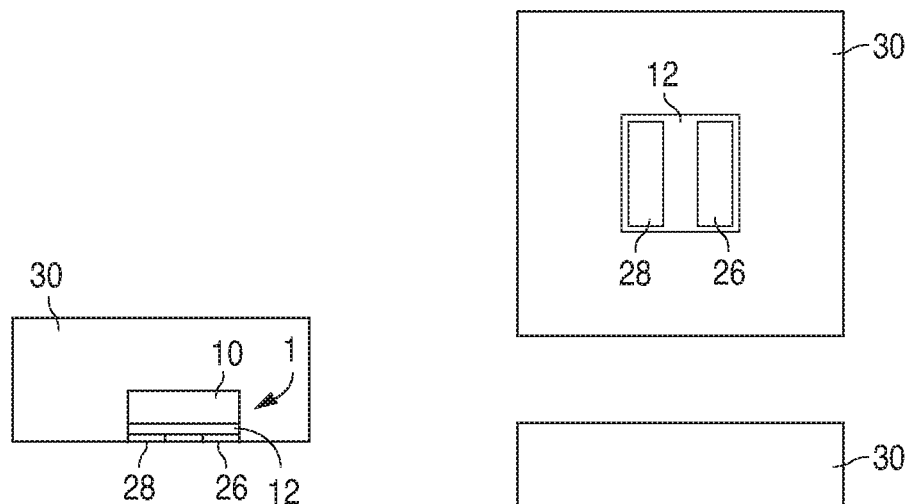
FIG. 3 is a cross sectional view of an LED with a wavelength converting layer according to embodiments of the invention.
Figure 4:
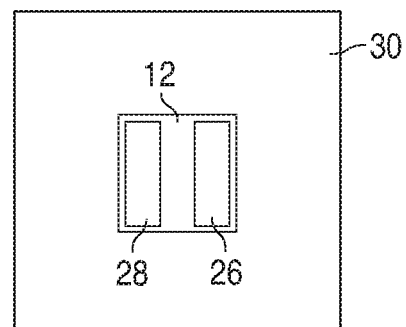
FIG. 4 is a bottom view of the structure illustrated in FIG. 3.
Figure 5:
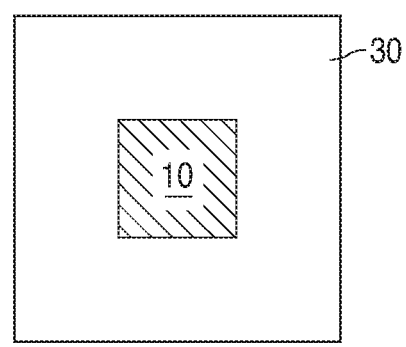
FIG. 5 is a top view of the structure illustrated in FIG. 3.

FIGS. 3, 4, and 5 illustrate an LED with a wavelength converting layer disposed on five sides, according to exemplary embodiments of the invention. FIG. 3 is a cross sectional view, FIG. 4 is a bottom view, and FIG. 5 is a cross sectional view taken from the top, in a plane where the cross section intersects the substrate 10 of the LED. LED 1 may be the LED illustrated in FIG. 2 or any other suitable device. Wavelength converting layer 30 covers the top, as illustrated in FIG. 3, and all sides, as illustrated in FIGS. 4 and 5, of LED 1. (LED 1 as illustrated in FIGS. 3, 4, and 5 is rectangular, so it has four sides and the substrate side covered by wavelength converting layer 30. LEDs of other shapes are within the scope of the invention—wavelength converting layer 30 in some embodiments would cover all sides of an LED of arbitrary shape.) On the bottom surface of the structure, the interconnects 26 and 28 are exposed, to facilitate a user attaching the structure to another structure such as a PC board.

One example of a prior art packaged LED includes a vertical LED with a wirebond that attaches the LED to a molded leadframe cup. After forming the wirebond, the cup is filled with a silicone/phosphor slurry. This architecture may be referred to as "goop in cup". The goop in cup architecture is low cost and easy to manufacture. However, the goop in cup architecture is limited in reliably handling high input power densities due to the high thermal resistance (as high as ~20 C/W) of the LED die, the wirebond, and the phosphor/silicone material (the "goop"). Flip chip type LEDs may also be disposed in the goop in cup architecture. An advantage of a flip chip is that the thermal resistance of the LED and typical flip chip interconnects is relatively low (typically <5 C/W). However, the thermal resistance of the phosphor/silicone material is still high and as a result the device cannot reliably handle high power densities.

In the structure illustrated in FIGS. 3, 4, and 5, because wavelength converting layer 30 is formed over LED 1 by a technique (other than dispensing over the LED, as in the goop in cup architecture described above) that permits wavelength converting layer 30 to have a high particle content as compared to a phosphor/silicone material used in goop in cup devices. Accordingly, wavelength converting layer 30 may have a high content of particles with high thermal conductivity, which may improve the thermal conductivity of wavelength converting layer 30 and therefore the thermal conductivity of the structure.

In some embodiments, wavelength converting layer 30 includes three components, a wavelength converting material, a transparent material, and an adhesive material.

The wavelength converting material may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure e.g. a yellow emitting material may be augmented with red emitting material.

The transparent material may be, for example, a powder, particles, or other material with a high thermal conductivity; for example, with a higher thermal conductivity that either the wavelength converting material or the adhesive. In some embodiments, the transparent material has a higher thermal conductivity than common silicone materials, which may have a thermal conductivity around 0.1-0.2 W/mK. In some embodiments, the transparent material is substantially index matched to the adhesive material, described below. For example, the indices of refraction of the transparent material and the adhesive material may vary less than 10% in some embodiments. In some embodiments, the index of refraction of the transparent material is at least 1.5. Examples of suitable transparent materials include glass particles or beads.

The adhesive material may be any material that binds together the transparent material and the wavelength converting material. The adhesive material may be selected to have an index of refraction of at least 1.5 in some embodiments. In some embodiments, the adhesive material is a moldable, thermoset material. Examples of suitable materials include silicone, epoxy, and glass. The adhesive material and the transparent material are typically different materials, or the same material in different forms, though they need not be. For example, the transparent material may be glass particles, while the adhesive material may be molded glass. In some embodiments, the adhesive material is a sol gel material. In embodiments where the adhesive material is a sol gel, a mixture of wavelength converting material, transparent material, and sol gel liquid may be dispensed over the LEDs 1, then water is evaporated from the sol gel liquid, leaving a silicate network that is essentially a glass with wavelength converting material and transparent material embedded in the silicate network.

In some embodiments, the wavelength converting layer 30 is mostly transparent material, with relatively less wavelength converting material and adhesive material. The wavelength converting layer 30 may be by weight at least 50% transparent material in some embodiments, 60% transparent material in some embodiments, and no more than 70% transparent material in some embodiments. The wavelength converting layer 30 may be by weight at least 20% wavelength converting material in some embodiments, 30% wavelength converting material in some embodiments, and no more than 40% wavelength converting material in some embodiments. The wavelength converting layer 30 may be by weight at least 5% adhesive material in some embodiments, 10% adhesive material in some embodiments, and no more than 20% adhesive material in some embodiments.

The thermal conductivity of the wavelength converting layer 30 may be at least 0.5 W/mK in some embodiments and at least 1 W/mK in some embodiments. In contrast, the goop in a goop in cup architecture typically has a thermal conductivity of no more than 0.1 W/mK.

Figure 6:
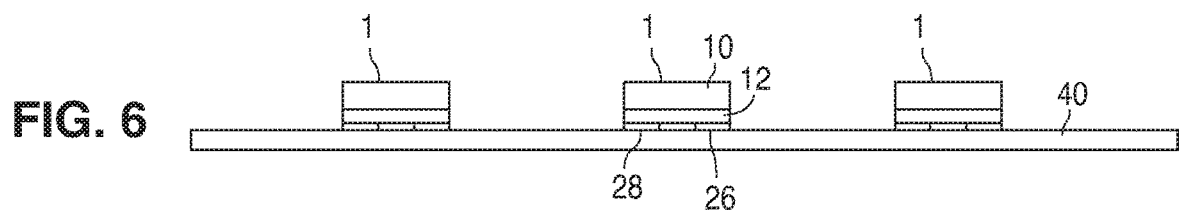
FIG. 6 illustrates LEDs attached to a substrate.
Figure 7:
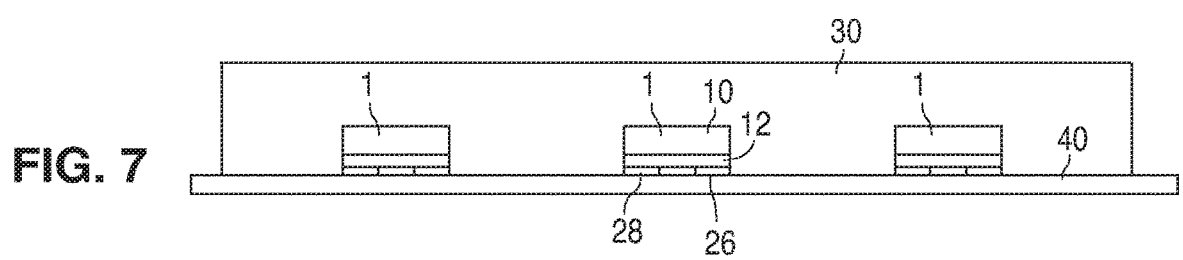
FIG. 7 illustrates the structure of FIG. 6 after molding a wavelength converting layer over the LEDs.

The structure illustrated in FIGS. 3, 4, and 5 may be formed according to the method illustrated in FIGS. 6, 7, 8, and 9. After the LEDs are formed and separated from a wafer of LEDs, they are "binned", meaning LEDs with similar peak emission wavelengths are grouped according to the characteristics of the wavelength converting material necessary for the wavelength converted LED to meet a specification for a given application. In FIG. 6, individual LEDs from a single bin are disposed on a substrate 40. Substrate 40 is a temporary handling substrate. Any suitable material may be used, such as carrier tape. Though single LEDs are illustrated in FIG. 7, LEDs 1 may be diced from a wafer into groups rather than as single LEDs.

In FIG. 7, wavelength converting layer 30, as described above, is molded over LEDs 1. For example, a mold (not shown in FIG. 7) may be disposed over a group of LEDs 1, then filled with molding material. Wavelength converting layer 30 may include a thermoset adhesive material in liquid form. The structure is treated, for example by heating, to transform the thermoset adhesive material into a solid. The mold is then removed. The wavelength converting layer 30 is disposed over the tops of LEDs 1 and between neighboring LEDs 1.

Figure 8:
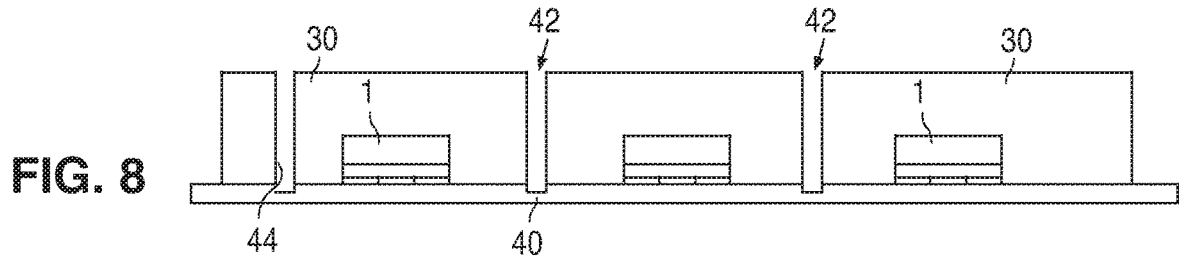
FIG. 8 illustrates the structure of FIG. 7 after separating the LEDs.

In FIG. 8, individual LEDs are separated, for example by cutting the wavelength converting layer 30 between neighboring LEDs in streets 42. Any suitable cutting technique may be used, such as diamond sawing or laser cutting. Preferably the cutting technique should not cut through the substrate 40. The cutting illustrated in FIG. 8 may result in substantially vertical sidewalls 44 in some embodiments, as illustrated in FIG. 8. In some embodiments, the sidewalls 44 are angled or otherwise shaped, for example to enhance light extraction from wavelength converting layer 30.

Figure 9:
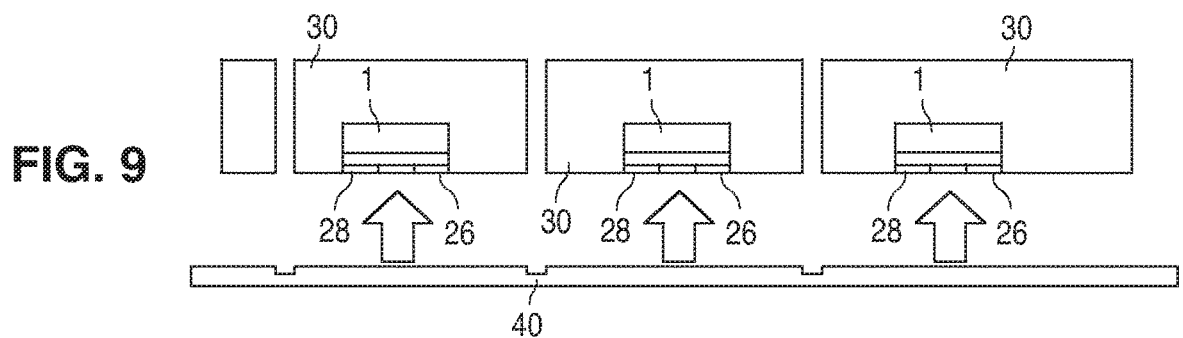
FIG. 9 illustrates the structure of FIG. 8 after removing the LEDs from the substrate.

In FIG. 9, the separated LEDs are released from substrate 40 by any suitable method including, for example, thermal release, transfer to a second substrate, or direct picking. Individual LEDs may be tested, and are otherwise ready to be mounted by a user to a structure such as a PC board. The LEDs are mounted on another structure for example by soldering or any other suitable mounting technique through interconnects 28 and 26 on the bottoms of LEDs 1.

Figure 10:
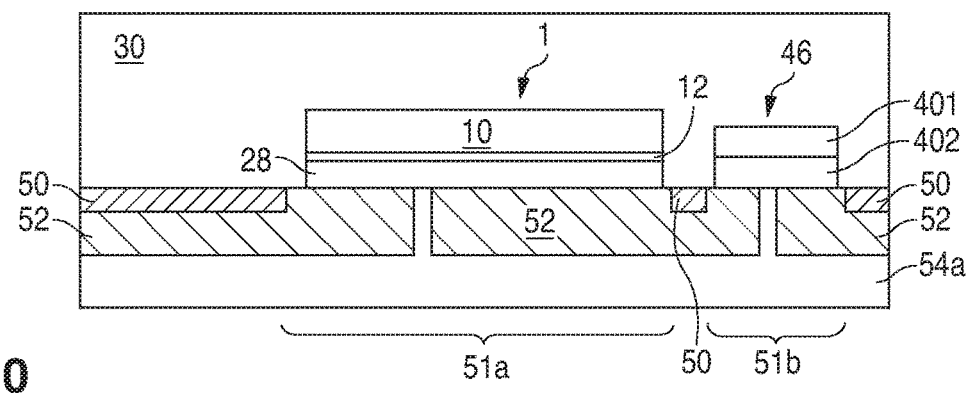
FIG. 10 is a cross section of a structure including an LED and an additional chip.

In some embodiments, a chip 46 is mechanically connected to LED 1 through wavelength converting layer 30, as illustrated in FIG. 10. Chip 46 may include a device for transient voltage suppression (TVS), power conditioning circuitry, other circuitry, or a device for any other suitable function. Chip 46 may include, for example, a body 401 and contacts 402 and 403. (Only one contact, contact 402, is illustrated in the cross section illustrated in FIG. 10. Both contacts 402 and 403 may be seen in the bottom views illustrated in FIGS. 14, 16, 18, and 20.) A reflective layer 50 is disposed on the bottom of wavelength converting layer 30. An opening 51a in reflective layer 50 surrounds LED 1. An opening 51b in reflective layer 50 surrounds chip 46. A dielectric layer 52 is disposed below reflective layer 50. Openings in the dielectric layer 52 provide electrical connection to contact 28 on LED 1 and contact 402 on chip 46. A bonding pad 54a disposed below dielectric layer 52 electrically connects contact 28 on LED 1 to contact 402 on chip 46. Outside the plane illustrated in FIG. 10, a second bonding pad disposed below dielectric layer 52 electrically connects contact 26 on LED 1 to contact 403 on chip 46.

Figure 1:
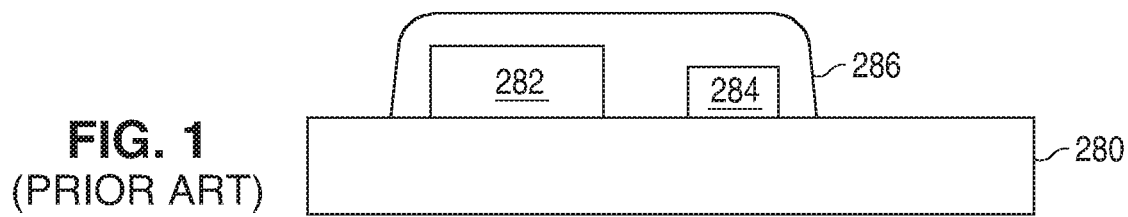
FIG. 1 illustrates a prior art LED and TVS chip on a submount with a phosphor-containing lens molded over the LED and TVS chip.

In contrast to the device illustrated in FIG. 1, where the LED 282 and TVS chip 284 are electrically and mechanically connected through a submount 280, in the device illustrated in FIG. 10, LED 1 and chip 46 are mechanically connected through wavelength converting layer 30.

The structure illustrated in FIG. 10 may be formed as illustrated in FIGS. 11, 12, 13, 14, 15, 16, 17, 18, 19, 20, 21, and 22. Although 3 groups of LEDs 1 and chips 46 are shown in these figures, these methods can be applied to any number of groups of LEDs 1 and chips 46.

Figure 11:
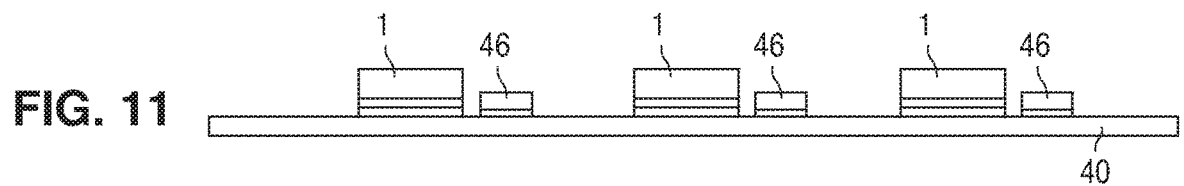
FIG. 11 illustrates LEDs and additional chips attached to a substrate.

In FIG. 11, LEDs 1 and chips 46 are disposed on a substrate 40, which may be, for example, carrier tape as described above in reference to FIG. 6.

Figure 12:
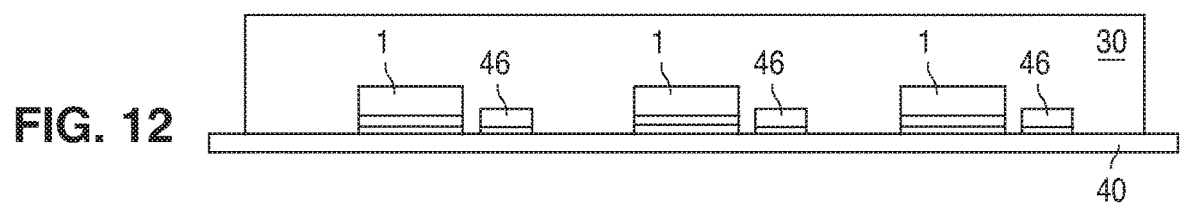
FIG. 12 illustrates the structure of FIG. 11 after molding a wavelength converting layer over the LEDs and additional chips.

In FIG. 12, wavelength converting layer 30 is molded over the LEDs 1 and chips 46, as described above in reference to FIG. 7.

Figure 13:
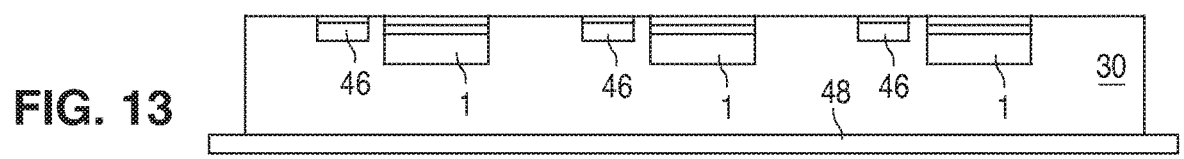
FIG. 13 illustrates the structure of FIG. 12 after releasing the first substrate and attaching a second substrate.

In FIG. 13, the structure of FIG. 12 is transferred to a second substrate 48. Substrate 48, like substrate 40, may be any material suitable for temporary handling of the structure including the LEDs 1, chips 46, and wavelength converting layer 30. For example, substrate 48 may be carrier tape. Typically the second substrate 48 is connected to a surface of the wavelength converting layer 30 opposite the substrate 40, followed by separation of the substrate 40 from the LEDs 1 and chips 46. After removing substrate 40, the contacts of the LEDs 1 and chips 46 are exposed for further processing.

Figure 14:
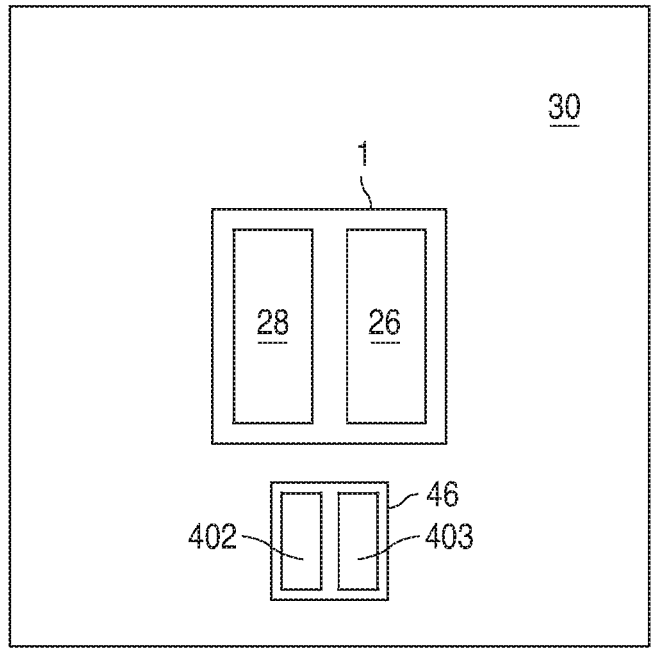
FIG. 14 is a bottom view of one of the LEDs and additional chips illustrated in FIG. 13.

FIG. 14 illustrates the contact-side of a mechanically connected group which includes at least a single LED 1 and a single chip 46. The view illustrated in FIG. 14 is a view of the top of the structure as illustrated in FIG. 13 and the bottom of the structure as illustrated in FIG. 12. Because the finished structure is typically mounted with the contacts on the bottom such that light is extracted from the top, in the following description, the view illustrated in FIG. 14 is referred to as the bottom of the structure.

In FIG. 14, the metal interconnects 28 and 26 on LED 1 may be substantially aligned with the metal contacts 402 and 403 on chip 46. Wavelength converting layer 30 is disposed around LED 1 and chip 46.

Figure 15:
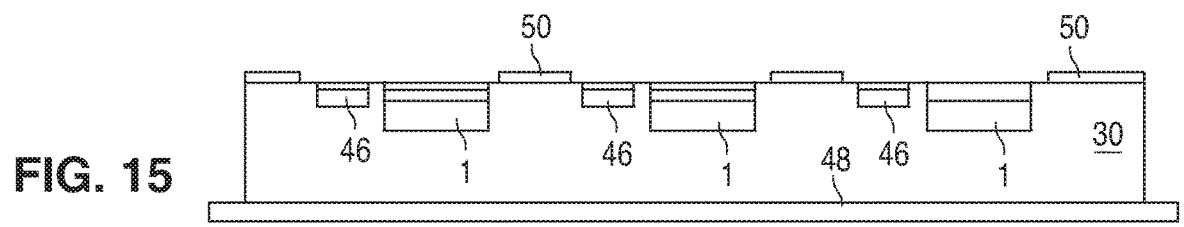
FIG. 15 illustrates the structure of FIG. 13 after forming a reflective layer.
Figure 16:
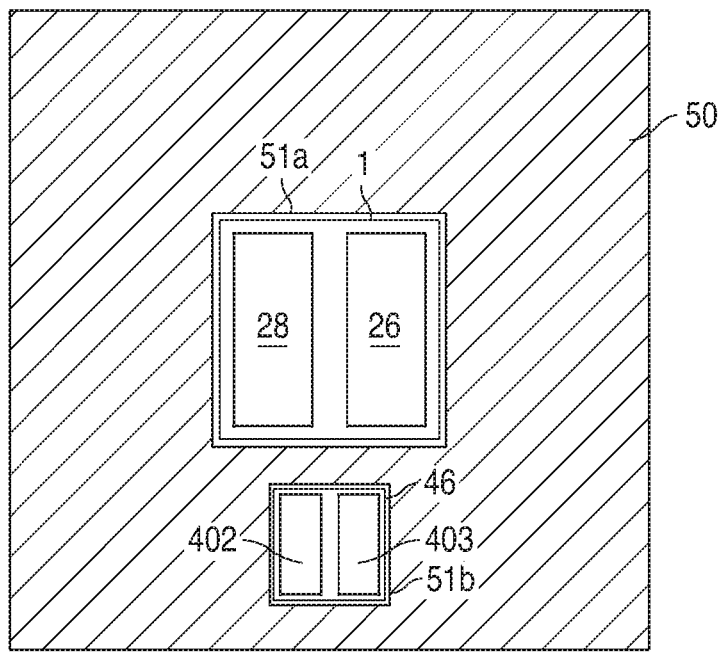
FIG. 16 is a bottom view of one of the LEDs and additional chips after forming the reflective layer illustrated in FIG. 15.

In FIG. 15, a reflective layer 50 is formed over the structure illustrated in FIG. 13. FIG. 16 illustrates a bottom view of a single LED 1 and chip 46 after forming the reflective layer 50. Reflective layer 50 is represented in the figures by hatching that extends from the bottom left to the top right of the figure. As illustrated in FIG. 15, reflective layer 50 is patterned to form openings 51a and 51b. Opening 51a surrounds LED 1 and opening 51b surrounds chip 46. Reflective layer 50 may be any suitable reflective material, such as a metal, Ag, Al, a reflective coating, or a reflective paint. Reflective layer 50 is often conductive thought it need not be. Reflective layer 50 may be formed by any suitable technique such as, for example, sputtering, and may be patterned by any suitable technique such as, for example, photolithography.

Figure 17:
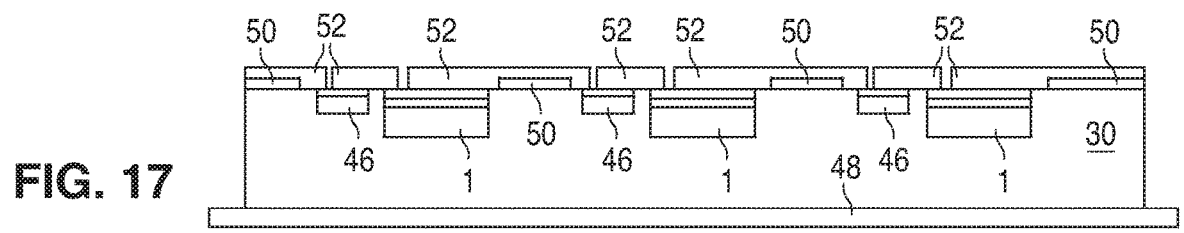
FIG. 17 illustrates the structure of FIG. 15 after forming a dielectric layer.
Figure 18:
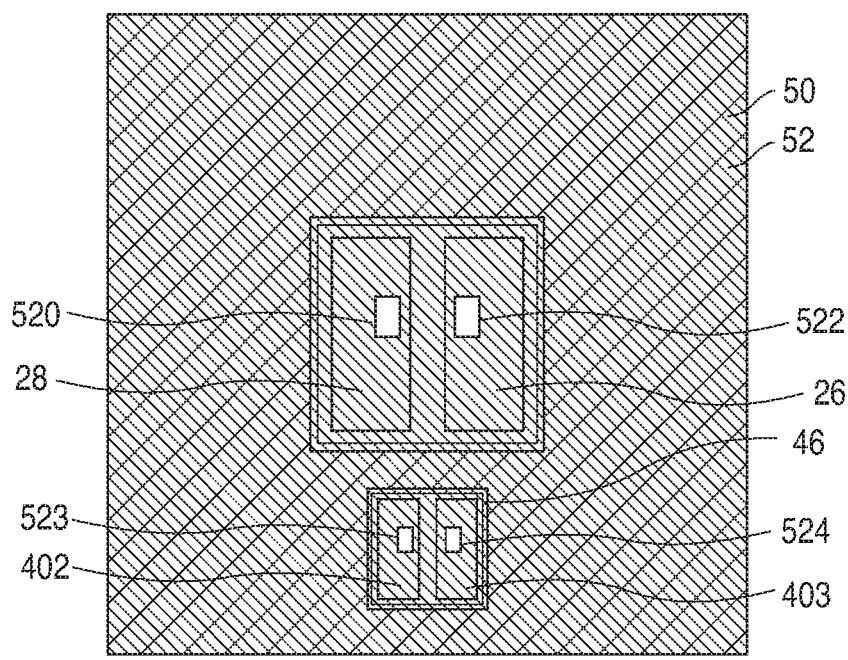
FIG. 18 is a bottom view of one of the LEDs and additional chips after forming the dielectric layer illustrated in FIG. 17.

In FIG. 17, a dielectric layer is formed over the structure illustrated in FIG. 15. FIG. 18 illustrates a bottom view of a single LED 1 and chip 46 after forming the dielectric layer 52. Dielectric layer 52 is represented by hatching that extends from the top left to the bottom right of the figure. Dielectric layer 52 is patterned to form openings that facilitate electrical connection to the interconnects on LED 1 and the contacts on chip 46. Opening 520 is formed over interconnect 28; opening 522 is formed over interconnect 26; opening 523 is formed over contact 402; and opening 524 is formed over contact 403. Dielectric layer 52 may be any suitable material such as, for example, one or more oxides of silicon, one or more nitrides of silicon, dielectric, or benzocyclobutene, formed by any suitable technique.

Figure 19:
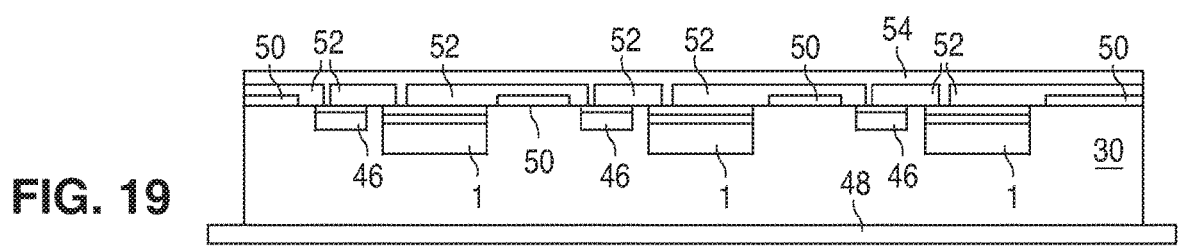
FIG. 19 illustrates the structure of FIG. 17 after forming contact pads.
Figure 20:
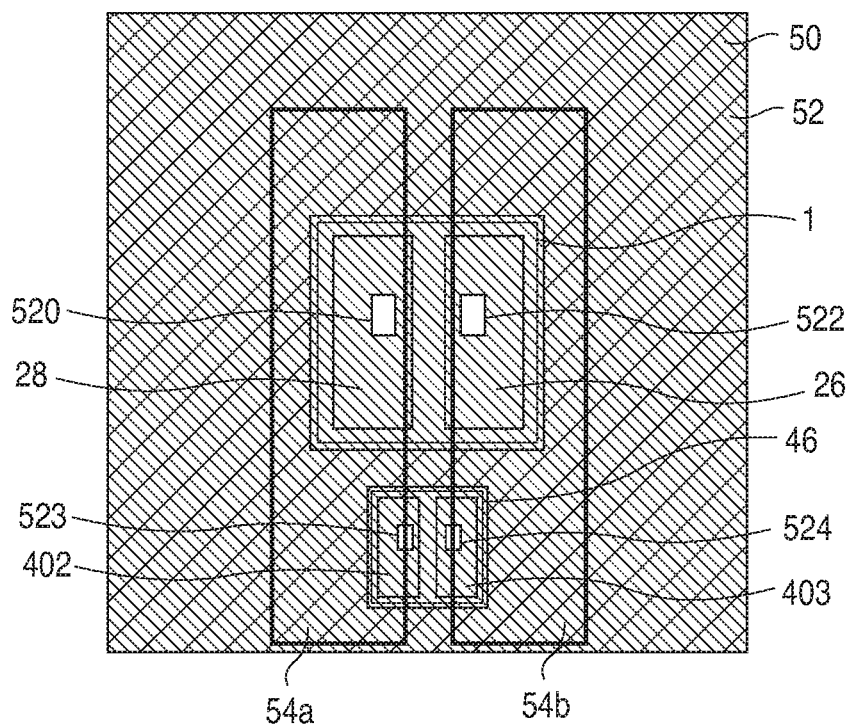
FIG. 20 is a bottom view of one of the LEDs and additional chips after adding the contact pads illustrated in FIG. 19.

In FIG. 19, a metal layer 54 which forms conductive contact pads 54a and 54b, (only pad 54a is shown in the side view) are formed over the structure illustrated in FIG. 17. FIG. 20 illustrates a bottom view of a single LED 1 and chip 46 after forming contact pads 54a and 54b. (In FIG. 19, the metal layer which forms the contact pads is labeled 54. In FIG. 20, the individual contact pads 54a and 54b are illustrated.) Contact pad 54a is electrically connected to interconnect 28 on LED 1 through opening 520 in dielectric layer 52. Contact pad 54a is also electrically connected to contact 402 on chip 46 through opening 523 in dielectric layer 52. Contact pad 54b is electrically connected to interconnect 26 on LED 1 through opening 522 in dielectric layer 52. Contact pad 54b is also electrically connected to contact 403 on chip 46 through opening 524 in dielectric layer 52. Contact pads 54a and 54b are electrically isolated from each other by a space between them, and by dielectric layer 52. Contact pads 54a and 54b may be any suitable conductive material. Contact pads 54a and 54b are typically metals such as Au or Ag. Contact pads 54a and 54b may be formed and patterned by any suitable technique. For example, contact pads 54a and 54b may be formed by sputter-depositing a seed layer of, for example, CuN, then plating a Au or Ag layer. Contact pads 54a, 54b, interconnects 28, 26, contacts 402, 406 and openings 520, 522, 523, and 524 are not necessarily drawn to scale and may have different proportions than shown in FIG. 20. Contact pads 54a and 54b may be patterned so they do not extend all the way to the top and bottom of the device as illustrated in FIG. 20, though this is not required, as illustrated in FIGS. 19 and 21.

Figure 21:
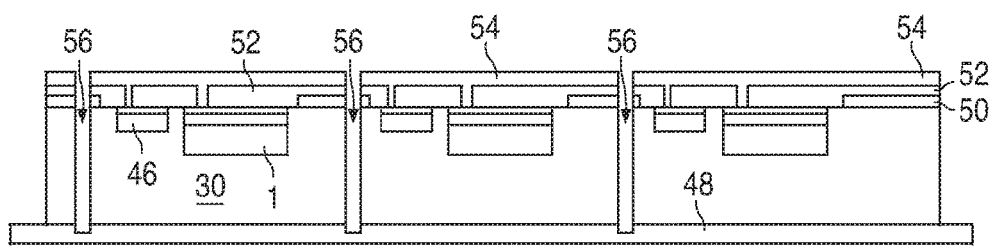
FIG. 21 illustrates the structure of FIG. 19 after separating the LEDs.

In FIG. 21, the LEDs 1 and chips 46 are separated, for example by cutting the wavelength converting layer 30 between neighboring LEDs in streets 56, as described above in reference to FIG. 8.

Figure 22:
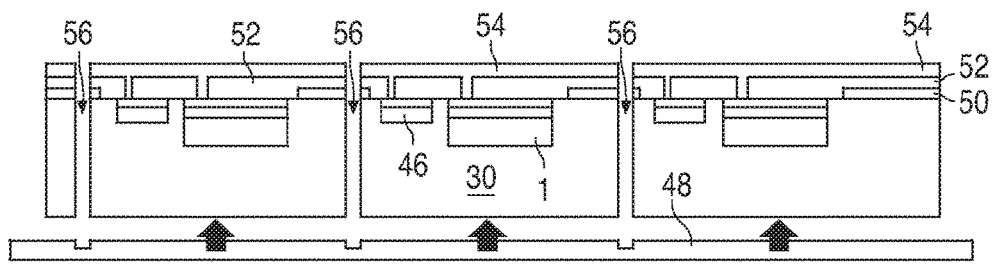
FIG. 22 illustrates the structure of FIG. 21 after removing the LEDs from the substrate.

In FIG. 22, the separated devices are removed from substrate 48, as described above in reference to FIG. 9. The devices may be flipped over and mounted by a user to a suitable structure such as a PC board by solder-attaching or otherwise electrically and mechanically connecting pads 54a and 54b to the structure.

Figure 23:
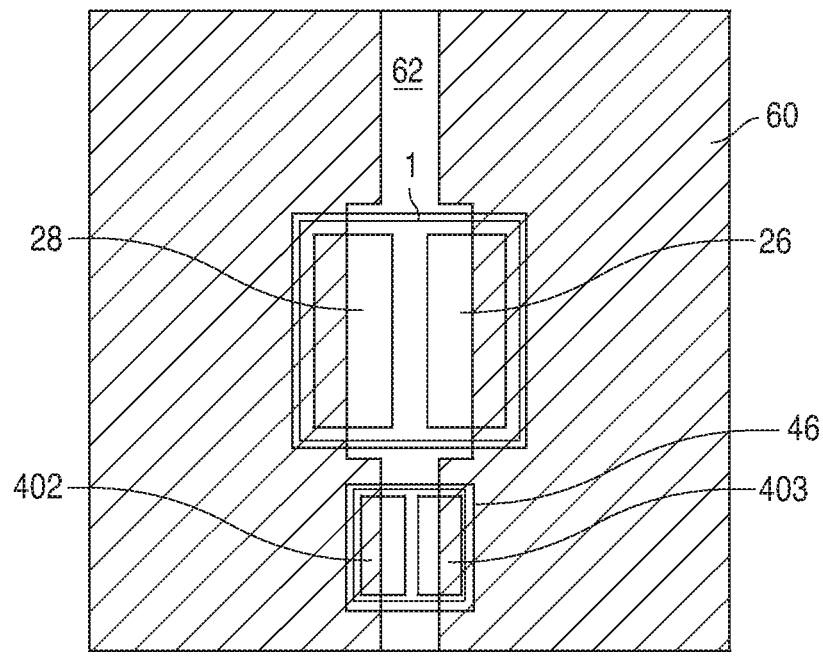
FIG. 23 is a bottom view of alternative arrangement of a reflective layer on an LED and an additional chip.
Figure 24:
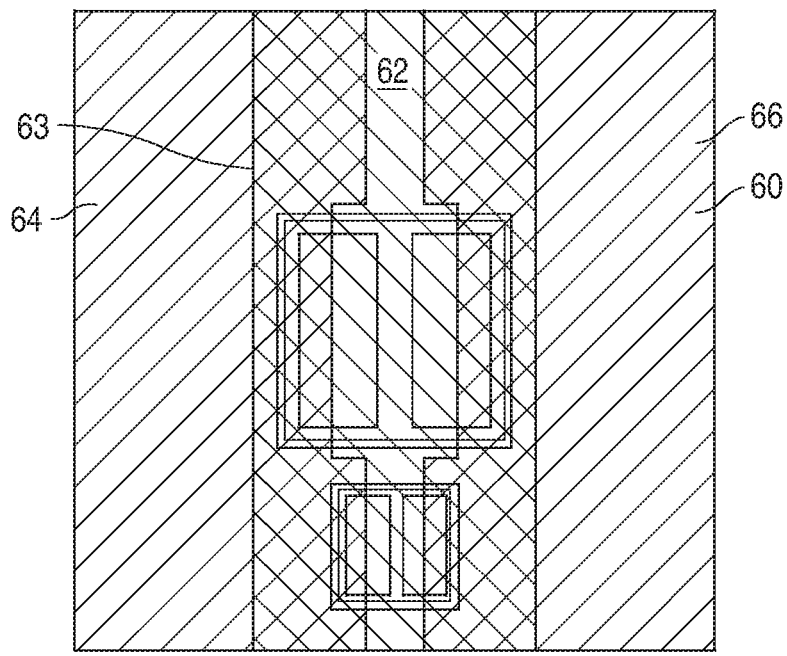
FIG. 24 illustrates the structure of FIG. 23 after forming a dielectric layer.

FIGS. 23 and 24 illustrate an alternative structure including an LED 1 and a chip 46. In FIG. 23, a reflective material 60 is disposed over the structure illustrated in FIG. 13. The reflective material 60 is patterned to form an opening 62 that separates two regions of reflective material on two sides of the device. Reflective material may be, for example, one of the materials listed above for reflective material 50, described in FIGS. 15 and 16. Reflective material 60 is a conductive material. The left-side portion of reflective material 60 is in direct contact with a portion of interconnect 28 on LED 1 and contact 402 on chip 46. The right-side portion of reflective material 60 is in direct contact with a portion of interconnect 26 on LED 1 and contact 403 on chip 46.

In FIG. 24, a dielectric layer 63 is formed over the center of the structure. Dielectric layer 63, which may be, for example, one of the materials listed above for dielectric material 52, described in FIGS. 17 and 18, covers the opening 62 between the left-side and right-side portions of reflective material 60. Dielectric layer 63 also covers a portion of each of the left-side and right-side portions of reflective material 60. Dielectric layer 63 is limited in extent such that a portion 64 of reflective material 60 on the left side of the device is not covered by dielectric layer 63, and a portion 66 of reflective material 60 on the right side of the device is not covered by dielectric layer 63.

After separation in FIGS. 21 and 22, the device illustrated in FIG. 24 may be mounted by a user on a structure such as a PC board by solder-attaching or otherwise electrically and mechanically connecting portions 64 and 66 of the reflective material 60 to the structure. An interconnect (such as, for example, solder) used to attach the structure of FIG. 24 to a structure such as a PC board may compensate for the difference in height between portions 64 and 66 and dielectric 63.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A structure comprising:
a light emitting device comprising a first surface, an oppositely positioned second surface, and sides surfaces connecting the first surface and the second surface;
a transient voltage suppression chip comprising a first surface, an oppositely positioned second surface, and sides surfaces connecting the first surface and the second surface, the second surface of the transient voltage suppression chip aligned with and parallel to the second surface of the light emitting device;
a wavelength converting layer disposed on the first surface and the side surfaces of the light emitting device, on the first surface and side surfaces of the transient voltage suppression chip, and between the light emitting device and the transient voltage suppression chip, the wavelength converting layer mechanically connecting the light emitting device to the transient voltage suppression chip, the wavelength converting layer comprising a surface aligned with the second surface of the light emitting device and the second surface of the transient voltage suppression chip;
a reflective layer disposed on the surface of the wavelength converting layer aligned with the second surface of the light emitting device and the second surface of the transient voltage suppression chip;
a dielectric layer disposed on a surface of the reflective layer opposite from the wavelength converting layer; and
an electrically conductive connection between the light emitting device and the transient voltage suppression chip.

2. The structure of claim 1, wherein the light emitting device is configured to emit light having a first peak wavelength and the wavelength converting layer comprises a mixture of: a wavelength converting material to absorb light emitted by the light emitting device and emit light having a second peak wavelength, an adhesive material, and a plurality of transparent particles having a higher thermal conductivity than the adhesive.

3. The structure of claim 1, wherein the wavelength converting layer is molded on the light emitting device and the transient voltage suppression chip.

4. The structure of claim 2, wherein the wavelength converting material comprises no more than 40% of the weight of the wavelength converting layer.

5. The structure of claim 2, wherein the adhesive is one of silicone, epoxy, sol gel material, and glass.

6. The structure of claim 2, wherein the transparent particles and the adhesive material are comprised of different materials.

7. The structure of claim 2, wherein the adhesive material comprises a silicate network.

8. The structure of claim 1, wherein a thermal conductivity of the wavelength converting layer is at least 1 W/mK.

9. The structure of claim 2, wherein indices of refraction of the transparent particles and the adhesive material differ less than 10%.

10. The structure of claim 2, wherein the adhesive material comprises no more than 20% of the weight of the wavelength converting layer.

11. The structure of claim 1, wherein the dielectric layer comprises openings providing access to the light emitting device and to the transient voltage suppression chip, and further comprising an electrically conductive pad disposed on the dielectric layer, the pad providing the electrically conductive connection between the light emitting device and the transient voltage suppression chip.

12. The structure of claim 1, wherein the reflective layer is conductive and is patterned to provide the electrically conductive connection between the light emitting device and the transient voltage suppression chip.

13. A structure comprising:
a light emitting device comprising a first surface, an oppositely positioned second surface, and sides surfaces connecting the first surface and the second surface;

a transient voltage suppression chip comprising a first surface, an oppositely positioned second surface, and sides surfaces connecting the first surface and the second surface, the second surface of the transient voltage suppression chip aligned with and parallel to the second surface of the light emitting device;

a wavelength converting layer disposed on the first surface and the side surfaces of the light emitting device, on the first surface and side surfaces of the transient voltage suppression chip, and between the light emitting device and the transient voltage suppression chip, the wavelength converting layer mechanically connecting the light emitting device to the transient voltage suppression chip, the wavelength converting layer comprising a surface aligned with the second surface of the light emitting device and the second surface of the transient voltage suppression chip;

a reflective layer disposed on the surface of the wavelength converting layer aligned with the second surface of the light emitting device and the second surface of the transient voltage suppression chip;

a dielectric layer disposed on a surface of the reflective layer opposite from the wavelength converting layer, the dielectric layer comprising openings to provide access to the light emitting device and to the transient voltage suppression chip; and an electrically conductive pad disposed on the dielectric layer, the pad providing the electrically conductive connection between the light emitting device and the transient voltage suppression chip.

14. The structure of claim 13, wherein the light emitting device is configured to emit light having a first peak wavelength and the wavelength converting layer comprises a mixture of: a wavelength converting material to absorb light emitted by the light emitting device and emit light having a second peak wavelength, an adhesive material, and a plurality of transparent particles having a higher thermal conductivity than the adhesive.

15. The structure of claim 14, wherein the wavelength converting material comprises no more than 40% of the weight of the wavelength converting layer.

16. The structure of claim 14, wherein the adhesive material comprises no more than 20% of the weight of the wavelength converting layer.

17. The structure of claim 13, wherein a thermal conductivity of the wavelength converting layer is at least 1 W/mK.

18. A structure comprising:
a light emitting device comprising a first surface, an oppositely positioned second surface, and sides surfaces connecting the first surface and the second surface;

a transient voltage suppression chip comprising a first surface, an oppositely positioned second surface, and sides surfaces connecting the first surface and the second surface, the second surface of the transient voltage suppression chip aligned with and parallel to the second surface of the light emitting device;

a wavelength converting layer disposed on the first surface and the side surfaces of the light emitting device, on the first surface and side surfaces of the transient voltage suppression chip, and between the light emitting device and the transient voltage suppression chip, the wavelength converting layer mechanically connecting the light emitting device to the transient voltage suppression chip, the wavelength converting layer comprising a surface aligned with the second surface of the light emitting device and the second surface of the transient voltage suppression chip;

a reflective layer disposed on the surface of the wavelength converting layer aligned with the second surface of the light emitting device and the second surface of the transient voltage suppression chip, the reflective layer is conductive and is patterned to provide the electrically conductive connection between the light emitting device and the transient voltage suppression chip; and a dielectric layer disposed on a surface of the reflective layer opposite from the wavelength converting layer.

19. The structure of claim 18, wherein the light emitting device is configured to emit light having a first peak wavelength and the wavelength converting layer comprises a mixture of: a wavelength converting material to absorb light emitted by the light emitting device and emit light having a second peak wavelength, an adhesive material, and a plurality of transparent particles having a higher thermal conductivity than the adhesive.

20. The structure of claim 18, wherein a thermal conductivity of the wavelength converting layer is at least 1 W/mK.

* * * * *